(12) United States Patent
Adams et al.

(10) Patent No.: US 6,395,130 B1
(45) Date of Patent: May 28, 2002

(54) HYDROPHOBIC OPTICAL ENDPOINT LIGHT PIPES FOR CHEMICAL MECHANICAL POLISHING

(75) Inventors: John A. Adams, Escondido, CA (US); Robert A. Eaton, Scottsdale; John C. Ptak, Phoenix, both of AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

(21) Appl. No.: 09/441,436

(22) Filed: Nov. 16, 1999

Related U.S. Application Data

(63) Continuation-in-part of application No. 09/307,995, filed on May 10, 1999, which is a continuation-in-part of application No. 09/277,452, filed on Mar. 26, 1999, which is a continuation-in-part of application No. 09/093,467, filed on Jun. 8, 1998, now Pat. No. 6,106,662.

(51) Int. Cl.[7] .................................................. C23F 1/02
(52) U.S. Cl. .................................................. 156/345.13
(58) Field of Search .......................... 156/345; 451/66; 51/308; 216/88, 89, 90; 250/338.1, 201.4

(56) References Cited

U.S. PATENT DOCUMENTS

| | | | |
|---|---|---|---|
| 5,433,651 A | * 7/1995 | Lustig et al. | 451/6 |
| 5,605,760 A | 2/1997 | Roberts | 428/409 |
| 5,838,447 A | 11/1998 | Hiyama et al. | 356/381 |
| 5,899,792 A | * 5/1999 | Yagi | 451/6 |
| 5,931,722 A | 8/1999 | Ohmi et al. | 451/271 |
| 5,934,979 A | 8/1999 | Talieh | 451/41 |
| 5,938,504 A | 8/1999 | Talieh | 451/11 |
| 5,949,927 A | * 9/1999 | Tang | 385/12 |
| 6,068,539 A | * 5/2000 | Bajaj et al. | 451/6 |
| 6,071,177 A | * 6/2000 | Lin et al. | 451/6 |
| 6,106,662 A | * 8/2000 | Bibby, Jr. et al. | 156/345 |
| 6,146,242 A | * 11/2000 | Treur et al. | 451/6 |
| 6,190,234 B1 | * 2/2001 | Swedek et al. | 451/6 |

* cited by examiner

Primary Examiner—Gregory Mills
Assistant Examiner—Karla Moore
(74) Attorney, Agent, or Firm—Snell & Wilmer, L.L.P.

(57) ABSTRACT

An apparatus for optical endpoint detection of a chemical mechanical polishing process, that reduces or eliminates interference effects caused by air bubbles in chemical polishing slurries, and accumulation of polishing debris on components of the optical system. In particular, the invention provides hydrophobic light pipes and windows with polishing surfaces substantially coplanar with surrounding surfaces of polishing pads to thereby eliminate the effect of air bubbles trapped in recesses at the polishing pad surface. Moreover, hydrophobic surfaces have now been found to resist the accumulation of polished debris thereon, resulting in a reduction in loss of optical reflectance over polishing time. Accordingly, the invention provides an optical endpoint system that eliminates or reduces both the oversaturation and loss of reflectance problems of the prior art.

6 Claims, 4 Drawing Sheets

HYDROPHOBIC OPTICAL ENDPOINT LIGHT PIPES FOR CHEMICAL MECHANICAL POLISHING

STATEMENT OF RELATED APPLICATIONS

This application is a continuation-in-part of U.S. Ser. No. 09/093,467, U.S. Pat. No. 6,106,662 filed Jun. 8, 1998; U.S. Ser. No.09/277,452 filed Mar. 26, 1999; and U.S. Ser. No. 09/307,995 filed May 10, 1999.

BACKGROUND OF THE INVENTION

1. Field of Invention

This invention relates to chemical mechanical polishing apparatus, and more particularly to the technique of optical polishing endpoint detection. The invention provides an apparatus for optical endpoint detection that avoids contamination of the detector's optical fiber tip and resultant endpoint errors.

2. Description of the Related Art

Chemical mechanical polishing (CMP) has emerged as a crucial semiconductor technology, particularly for devices with critical dimensions smaller than 0.5 micron. One important aspect of CMP is endpoint detection (EPD), i.e., determining during the polishing process when to terminate the polishing.

Many users prefer EDP systems that are "in situ EPD systems", which provide EPD during the polishing process. Numerous in situ EPD methods have been proposed, but few have been successfully demonstrated in a manufacturing environment and even fewer have proved sufficiently robust for routine production use.

One group of prior art in situ EPD techniques involves the electrical measurement of changes in the capacitance, the impedance, or the conductivity of the wafer and calculating the endpoint based on an analysis of this data. To date, these particular electrically based approaches to EPD are not commercially available.

One other electrical approach that has proved production worthy is to sense changes in the friction between the wafer being polished and the polish pad. Such measurements are done by sensing changes in the motor current. These systems use a global approach, i.e., the measured signal assesses the entire wafer surface. Thus, these systems do not obtain specific data about localized regions. Further, this method works best for EPD for tungsten CMP because of the dissimilar coefficient of friction between the polish pad and the tungsten-titanium nitride-titanium film stack versus the polish pad and the dielectric underneath the metal. However, with advanced interconnection conductors, such as copper (Cu), the associated barrier metals, e.g., tantalum or tantalum nitride, may have a coefficient of friction that is similar to the underlying dielectric. The motor current approach relies on detecting the copper-tantalum nitride transition, then adding an overpolish time. Intrinsic process variations in the thickness and composition of the remaining film stack-layer mean that the final endpoint trigger time may be less precise than is desirable.

Another group of methods uses an acoustic approach. In a first acoustic approach, an acoustic transducer generates an acoustic signal that propagates through the surface layer(s) of the wafer being polished. Some reflection occurs at the interface between the layers, and a sensor positioned to detect the reflected signals can be used to determine the thickness of the topmost layer as it is polished. In a second acoustic approach, an acoustical sensor is used to detect the acoustical signals generated during CMP. Such signals have spectral and amplitude content that evolves during the course of the polish cycle. However, to date there has been no commercially available in situ endpoint detection system using acoustic methods to determine endpoint.

Finally, the present invention falls within the group of optical EPD systems. One approach for optical EPD systems is of the type disclosed in U.S. Pat. No. 5,433,651 to Lustig et al. in which a window is used to detect endpoint. However, the window complicates the CMP process because it presents to the wafer an inhomogeneity in the polish pad. Such a region can also accumulate slurry and polish debris.

Another approach is of the type disclosed in European application EP 0 824 995 A1, which uses a transparent window in the actual polish pad itself. A similar approach for rotational polishers is of the type disclosed in European application EP 0 738 561 A1, in which a pad with an optical window is used to transmit light used for EPD. In both of these approaches, various means for implementing a transparent window in a pad are discussed, but making measurements without a window were not considered. The methods and apparatuses disclosed in these patents require sensors to indicate the presence of a wafer in the field of view. Furthermore, integration times for data acquisition are constrained to the amount of time the window in the pad is under the wafer.

In another type of approach, the carrier is positioned on the edge of the platen so as to expose a portion of the wafer. A fiber optic based apparatus is used to direct light at the surface of the wafer, and spectral reflectance methods are used to analyze the signal. The drawback of this approach is that the process must be interrupted to position the wafer in such a way as to allow the optical signal to be gathered. In so doing, with the wafer positioned over the edge of the platen, the wafer is subjected to edge effects associated with the edge of the polish pad going across the wafer while the remaining portion of the wafer is completely exposed. An example of this type of approach is described in PCT application WO 98/05066.

In another approach, the wafer is lifted off of the pad a small amount, and a light beam is directed between the wafer and the slurry-coated pad. The light beam is incident at a small angle so that multiple reflections occur. The irregular topography on the wafer causes scattering, but if sufficient polishing is done prior to raising the carrier, then the wafer surface will be essentially flat and there will be very little scattering due to the topography on the wafer. An example of this type of approach is disclosed in U.S. Pat. No. 5,413,941. The difficulty with this type of approach is that the normal process cycle must be interrupted to make the measurement.

Yet another approach entails monitoring absorption of particular wavelengths in the infrared spectrum of a beam incident upon the backside of a wafer being polished so that the beam passes through the wafer from the nonpolished side of the wafer. Changes in the absorption within narrow, well-defined spectral windows correspond to changing thickness of specific types of films. This approach has the disadvantage that, as multiple metal layers are added to the wafer, the sensitivity of the signal decreases rapidly. One example of this type of approach is disclosed in U.S. Pat. No. 5,643,046.

One of the techniques for detecting when a silicon wafer surface has been polished to the extent required, is the use of optical endpoint detectors. Such detectors present several problems in practical application. In particular, optical endpoint detectors are subject to contamination of the sensor (optical fiber tip), resulting in errors or oversaturation as a result of receiving too much input light. The problems inherent in prior optical art endpoint detection systems may be better explained with reference to the attached FIGS. 1, 1A, and 2. FIG. 1 is a schematic representation, not to scale, of a common chemical mechanical polishing head, including a platen 10' to which is mounted a central spindle 12', for rotating the platen. The underface of the substantially circular platen 10' is covered with a polishing pad 14', that is attached by conventional means such as adhesives. As shown in FIG. 2, the polishing pad 14' is often scored with grooves running in "x" and "y" directions to form a grid with parallel x-direction grooves 16' and crossing perpendicular grooves 18'. These grooves are typically shallow and narrow and assist in the distribution of the chemical slurry during chemical mechanical polishing.

When an optical endpoint detector is used in the chemical mechanical polishing apparatus, an optical fiber 20' is inserted through a bore in the platen 10' and through a registering bore in pad 14' so that the distal tip of the fiber is flush with the lower end of a groove 16' and thus slightly spaced from the underside of pad 14' by the groove depth, as schematically shown in FIG. 1A. Ordinarily, two optical fibers 20' are used—one to act as a "send fiber," and the other a "receive fiber."

It has been found that the above-described prior art optical endpoint detection system is subject to interference from contaminants resulting from workpiece polishing, and air bubbles that form in the chemical slurry and that intensify light received through the "receive fiber" 20', sometimes resulting in oversaturation of its optical detector (not shown). As might be expected, during chemical mechanical polishing, especially of semiconductor wafers that include copper-based circuitry, copper particulates and reaction products of these particulates come into contact with optical fibers 20', resulting in fouling and contamination of these fibers. As a result, precise optical endpoint detection is adversely affected.

There exists a need for an optical endpoint detection system that is simple, self-cleaning or easy to clean, and that may be retrofitted to existing chemical mechanical cleaning apparatus.

SUMMARY OF THE INVENTION

This summary of invention section is intended to introduce the reader to aspects of the invention and is not a complete description of the invention. Particular aspects of the invention are pointed out in other sections hereinbelow, and the invention is set forth in the appended claims which alone demarcate its scope.

The invention provides an apparatus for optical endpoint detection of a polishing process of a semiconductor wafer or other workpiece. The apparatus includes a hydrophobic light pipe in optical communication with the workpiece, and extending at least partially through the polishing pad of the apparatus. In certain embodiments, an optical fiber is in optical communication with an opposite end of the light pipe and is spaced from the polishing surface of the polishing pad, thereby preventing contamination of the optical fiber. In other embodiments, the light detector is in direct optical communication with the light pipe.

In a preferred embodiment, the light pipe is hydrophobic, i.e., the chemical slurry used in the chemical mechanical polishing process does not adhere to light pipe surfaces. Thus, the light pipe may be of any optically transparent substance, that is either hydrophobic or has a hydrophobic coating. The preferred hydrophobic light pipes are less subject to fouling with chemical mechanical polishing particulate debris and less susceptible to interaction with bubbles in chemical slurries that may cause light amplification with potential oversaturation of the light detector.

In another embodiment, a "window" is provided in a polishing pad, the window is substantially transparent to transmit sufficient light for optical endpoint detection, and is further also hydrophobic. As with the light pipes, the hydrophobic windows are less susceptible to fouling with polishing debris, preferably have a surface flush with the polishing pad's polishing surface, and are less susceptible to interaction with bubbles that make cause light amplification and oversaturation of the light detector.

BRIEF DESCRIPTION OF THE DRAWINGS

The following drawings are illustrative of embodiments of the invention and therefore do not limit the scope of the invention, but are presented to assist in providing a proper understanding of the invention. The drawings are not to scale, and are intended for use in conjunction with the explanations in the following detailed description section.

DETAILED DESCRIPTION OF THE PREFERRED EMBODIMENT

Figure 1:
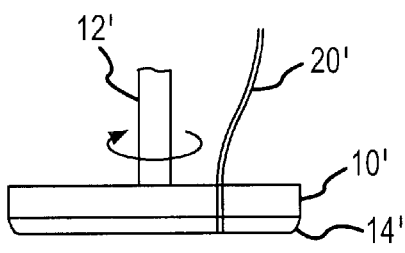
FIG. 1 is a schematic, illustrative depiction of a prior art chemical mechanical polishing pad, mounted to a rotatable platen.
Figure 1A:
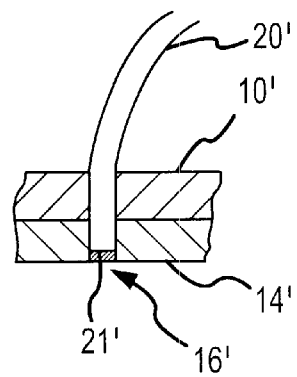
FIG. 1A is a magnified view of the optical fiber insertion to the prior art apparatus of FIG. 1.
Figure 2:
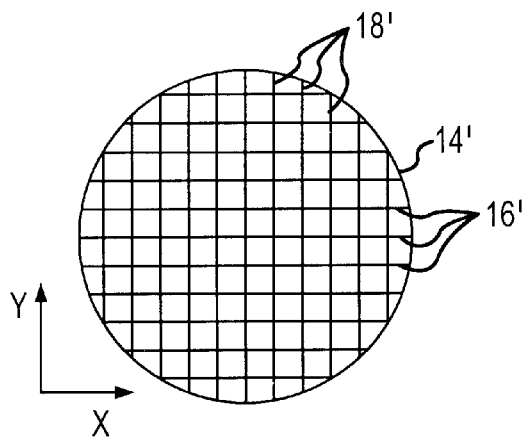
FIG. 2 is a schematic representation of the undersurface of a polishing pad (prior art), showing a grooved rectangular matrix.

This section describes aspects of the invention, and points out certain preferred embodiments of these aspects. This section is not intended to be exhaustive, but rather to inform and teach the person of skill in the art who will come to appreciate more fully other aspects, equivalents, and possibilities presented by the invention, and hence the scope of the invention as set forth in the claims which alone limit its scope.

The invention provides a significant advancement in the art of endpoint detection in chemical mechanical polishing. More particularly, the invention provides an optical endpoint detection system that is less susceptible to fouling by contaminants and interference from bubbles formed in chemical slurry. The apparatus requires less maintenance, is readily retrofitted to existing CMP machines, is relatively inexpensive, and simple to maintain.

In our parent applications, hereby incorporated by reference, an apparatus is provided for use with a tool for polishing thin films on a semiconductor wafer surface that detects an endpoint of a polishing process. In one embodiment, the apparatus includes a polish pad having a through-hole, a light source, a fiber optic cable assembly, a light sensor, and a computer. The light source provides light within a predetermined bandwidth. The light passes through a fiber optic cable, through the through-hole to illuminate the wafer surface during the polishing process. The light sensor receives reflected light from the surface through the fiber optic cable and generates data corresponding to the spectrum of the reflected light. The computer receives the reflected spectral data and generates an endpoint signal as a function of the reflected spectral data. In a metal film polishing application, the endpoint signal is a function of the intensities of at least two individual wavelength bands selected from the predetermined bandwidth. In a dielectric film polishing application, the endpoint signal is based upon fitting of the reflected spectrum to an optical reflectance model to determine remaining film thickness. The computer compares the endpoint signal to predetermined criteria and stops the polishing process when the endpoint signal meets the predetermined criteria. Unlike prior art optical endpoint detection systems, an apparatus according to the parent's invention, together with the endpoint detection methodology, advantageously allows for accuracy and reliability in the presence of accumulated slurry and polishing debris. This robustness makes the apparatus suitable for in situ EPD in a production environment.

In another aspect, the light source, fiber optic cable assembly and light sensor are attached to a platen of a chemical mechanical polishing machine. The computer is located external to the platen, along with a detector. A wireless link is used to communicate the reflected spectral data to the computer. This aspect of the present invention can be advantageously used in rotary chemical mechanical polishing machine in which a fiber optic or wired link between the light sensor and the computer would be difficult to implement.

In yet another aspect of the parent's invention, a rotary union is included to allow the fiber optic cable assembly to be used in a rotary chemical mechanical polishing machine. A through-cylinder is used to provide a protected passage through the platen for the fiber optic cable as the fiber optic cable extends into the through-hole in the polishing pad. The through-cylinder also prevents cooling fluid within the platen from leaking out, thereby preventing loss of cooling fluid and contamination of the polishing pad and the surface being polished.

The parent applications provide an apparatus for use with a tool for polishing thin films on a semiconductor wafer surface that detects an endpoint of a polishing process. In one embodiment, the apparatus includes a polishing pad having a through-hole, a light source, a fiber optic cable assembly, a light source, a fiber optic cable assembly, a light sensor, and a computer. The light source provides light within a predetermined bandwidth. The fiber optic cable propagates the light through the through-hole to illuminate the wafer surface during the polishing process. The light sensor receives reflected light from the surface through the fiber optic cable and generates data corresponding to the spectrum of the reflected light. The computer receives the reflected spectral data and generates an endpoint signal as a function of the reflected spectral data. In a metal film polishing application, the endpoint signal is a function of the intensities of at least two individual wavelength bands selected from the predetermined bandwidth. In a dielectric film polishing application, the endpoint signal is based upon fitting of the reflected spectrum to an optical reflectance model to determine remaining film thickness. The computer compares the endpoint signal to predetermined criteria. Unlike prior art optical endpoint detection systems, an apparatus according to the parent's invention, together with the endpoint detection methodology, advantageously allows for accuracy and reliability in the presence of accumulated slurry and polishing debris. This robustness makes the apparatus suitable for in situ EPD in a production environment.

Figure 3:
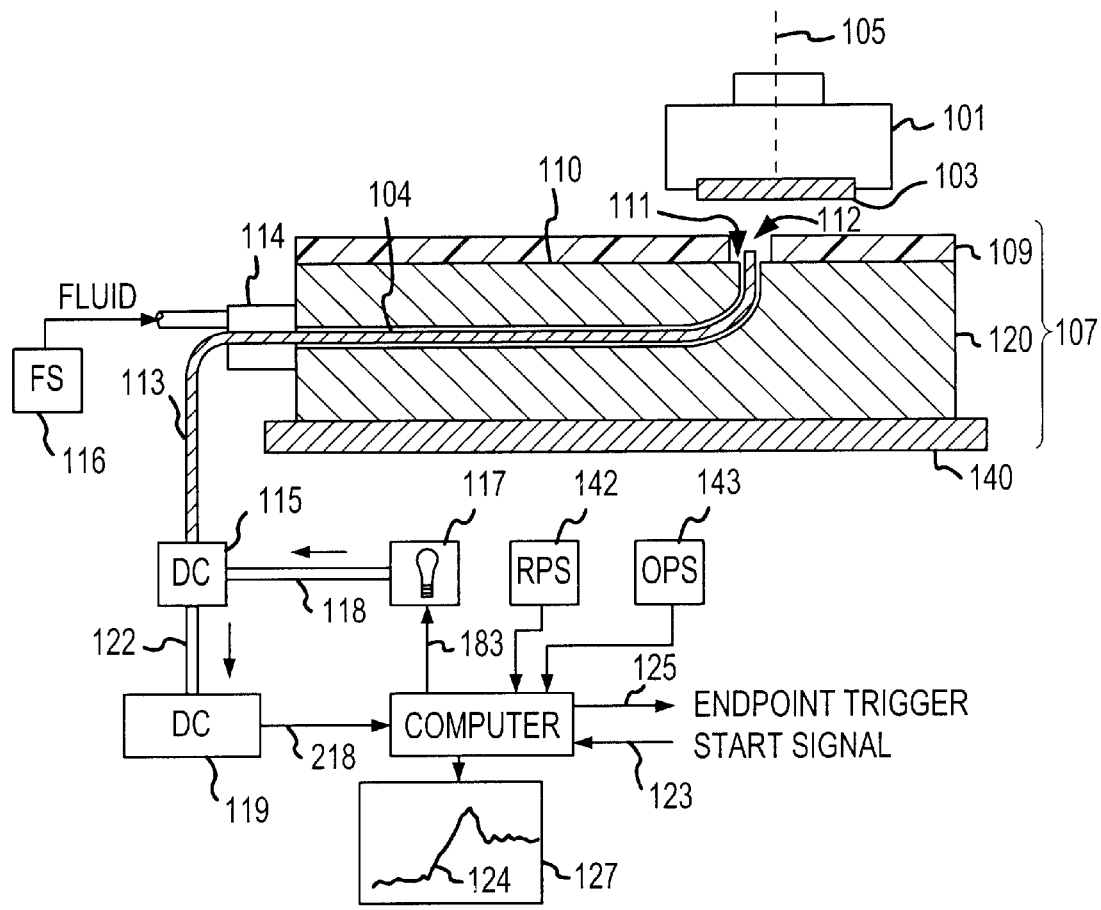
FIGS. 3 and 3A are a schematic representations of an apparatus using an optical endpoint detection system, in accordance with the parent's application.
Figure 3A:
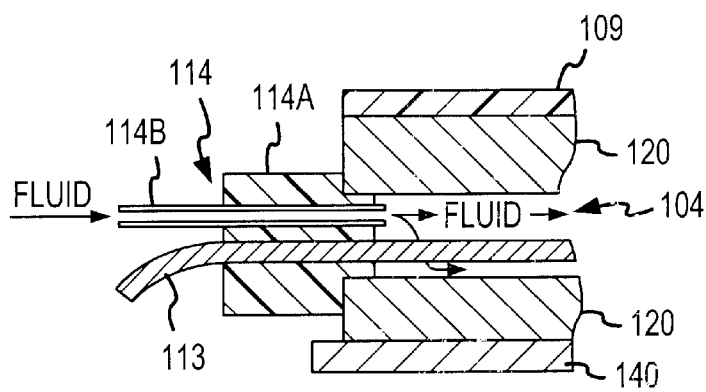

A schematic representation of the overall system of the invention of the parent application is shown in FIG. 3. As seen, a wafer chuck 101 holds a wafer 103 that is to be polished. The wafer chuck 101 preferably rotates about its vertical axis 105. A pad assembly 107 includes a polishing pad 109 mounted onto a pad backer 120. The pad backer 120 is in turn mounted onto a pad backing plate 140. In a preferred embodiment, the pad backer 120 is composed of urethane and the pad backing plate 140 is stainless steel. Other embodiments may use other suitable materials for the pad backer and pad backing. Further, the pad backing plate 140 is secured to a driver or motor means (not shown) that is operative to move the pad assembly 107 in the preferred orbital motion.

Polishing pad 109 includes a through-hole 112 that is coincident and communicates with a pinhole opening 111 in the pad backer 120. Further, a canal 104 is formed in the side of the pad backer 120 adjacent the backing plate. The canal 104 leads from the exterior side 110 of the pad backer 120 to the pinhole opening 111. In a preferred embodiment, a fiber optic cable assembly including a fiber optic cable 113 is inserted in the pad backer 120 of pad assembly 107, with one end of fiber optic cable 113 extending through the top surface of pad backer 120 and partially into through-hole 112. Fiber optic cable 113 can be embedded in pad backer 120 so as to form a watertight seal with the pad backer 120, but a watertight seal is not necessary to practice the invention. Further, in contrast to conventional systems as exemplified by U.S. Pat. No. 5,433,651 to Lustig et al. that use a platen with a window of quartz or urethane, the parent invention does not include such a window. Rather, the pinhole opening 111 is merely an orifice in the pad backer in which fiber optic cable 113 may be placed. Thus, in the parent invention, the fiber optic cable 113 is not sealed to the pad backer 120. Moreover, because of the use of a pinhole opening 111, the fiber optic cable 113 may even be placed within one of the existing holes in the pad backer and polishing pad used for the delivery of slurry without adversely affecting the CMP process. As an additional difference, the polishing pad 109 has a simple through-hole 112.

Fiber optic cable 113 leads to an optical coupler 115 that receives light from a light source 117 via a fiber optic cable 118. The optical coupler 115 also outputs a reflected light signal to a light sensor 119 via fiber optic cable 122. The reflected light signal is generated in accordance with the present invention, as described below.

A computer 121 provides a control signal 183 to light source 117 that directs the emission of light from the light source 117. The light source 117 is a broadband light source, preferably with a spectrum of light between 200 and 1000 nm in wavelength, and more preferably with a spectrum of light between 400 and 900 nm in wavelength. A tungsten bulb is suitable for use as the light source 117. Computer 121 also receives a start signal 123 that will activate the light source 117 and the EPD methodology. The computer also provides an endpoint trigger 125 when, through the analysis of the parent invention, it is determined that the endpoint of the polishing has been reached.

Orbital position sensor 143 provides the orbital position of the pad assembly while the wafer chuck's rotary position sensor 142 provides the angular position of the wafer chuck to the computer 121, respectively. Computer 121 can synchronize the trigger of the data collection to the positional information from the sensors. The orbital sensor identifies which radius the data is coming from and the combination of the orbital sensor and the rotary sensor determine which point.

In operation, soon after the CMP process has begun, the start signal 123 is provided to the computer 121 to initiate the monitoring process. Computer 121 then directs light source 117 to transmit light from the light source 117 via fiber optic cable 118 to optical coupler 115. This light in turn is routed through fiber optic cable 113 to be incident on the surface of the wafer 103 through pinhole opening 111 and the through-hole 112 in the polishing pad 109.

Reflected light from the surface of the wafer 103 is captured by the fiber optic cable 113 and routed back to the optical coupler 115 Although in the preferred embodiment of the parent, the reflected light is relayed using the fiber optic cable 113, it will be appreciated that a separate dedicated fiber optic cable (not shown) may be used to collect the reflected light. The return fiber optic cable would then preferably share the canal 104 with the fiber optic cable 113 in a single fiber optic cable assembly.

The optic coupler 115 relays this reflected light signal through fiber optic cable 122 to light sensor 119. Light sensor 119 is operative to provide reflected spectral data 218, referred to herein as the reflected spectral data 218, of the reflected light to computer 121.

One advantage provided by the optical coupler 115 is that rapid replacement of the pad assembly 107 is possible while retaining the capability of endpoint detection on subsequent wafers. In other words, the fiber optic cable 113 may simply be detached from the optical coupler 115 and a new pad assembly 107 may be installed (complete with new fiber optic cable 113). For example, this feature is advantageously utilized in replacing used polishing pads in the polisher. A spare pad backer assembly having a fresh polishing pad is used to replace the pad backer assembly in the polisher. The used polishing pad from the removed pad backer assembly is then replaced with a fresh polishing pad for subsequent use.

After a specified or predetermined integration time by the light sensor 119, the reflected spectral data 218 is read out of the detector array and transmitted to the computer 121, which analyzes the reflected spectral data 218. The integration time typically ranges from 5 to 150 ms, with the integration time being 15 ms in a preferred embodiment. One result of the analysis by computer 121 is an endpoint signal 124 that is displayed on monitor 127. Preferably, computer 121 automatically compares endpoint signal 124 to predetermined criteria and outputs an endpoint trigger 125 as a function of this comparison. Alternatively, an operator can monitor the endpoint signal 124 and select an endpoint based on the operator's interpretation of the endpoint signal 124. The endpoint trigger 125 causes the CMP machine to advance to the next process step.

Figure 4:
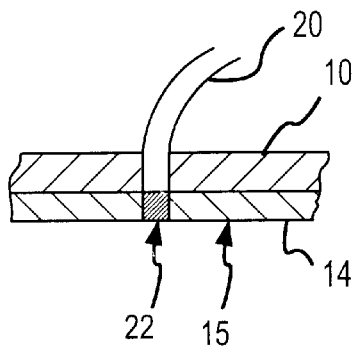
FIG. 4 is a schematic, not to scale, illustrative embodiment of the present invention.

In a preferred embodiment of the present invention, illustrated in FIG. 4, a light pipe 22 is inserted into a hole or bore in the underside of polishing pad 14. Preferably, the light pipe 22 is cylindrical and of sufficient height to extend throughout pad thickness up to the interface with platen 10. However, the light pipe may be taller, extending at least partially into a bore in the platen, if desired. Preferably, the distal end of light pipe 22 is flush with the polishing surface 15 of the polishing pad 14. In the preferred embodiment illustrated, the distal end of light pipe 22 would be in contact with the workpiece, such as a semiconductor wafer surface, being polished with polishing surface 15. This location assists in avoiding the formation of any entrapped liquid under the light pipe that might incorporate a bubble of air that might in turn affect light transmittance through the system. Thus, unlike the prior art optical fibers that extend into the grooves of the polishing pad, with distal ends flush with the groove and spaced from the undersurface of the polishing pad so that bubbles in liquids trapped in the grooves may affect the readings, the preferred location of the light pipe eliminates this factor.

Also, as shown in FIG. 4, the opposite end of light pipe 22 is in optical communication with optical fiber 20, that is in communication with a light detector (not shown).

As in the case of the prior art, at least two optical fibers should be used, one to receive and one to send light signals. In accordance with the invention, each of these optical fibers is spaced from direct physical contact with the workpiece, with a light pipe.

As indicated above, in a preferred embodiment, the light pipe is of a hydrophobic material, or coated with such a material. At present, the most preferred light pipe material is a clear silicone rubber plug of material sold under the trade name DEVCON, obtained from ITW Brands, of Wood Dale, Ill. Insertion of the plug into the pad is relatively simple: the plug is inserted into a hole in the pad of approximately the same diameter as the pipe, and any protruding end of the plug is trimmed flush with the pad polishing surface. The plug may be glued into the inside of the hole using a clear adhesive, such as a urethane ultraviolet light curable plastic; for example, Norland Optical Adhesive Type 65, obtainable from Norland Products, Inc., of New Brunswick, N.J. Clearly, other suitable materials may also be used as adhesives, or as plugs to form light pipes. The desired characteristics of the light pipe and adhesive materials are that they have requisite optical clarity and chemical resistance to the chemical slurry. It is also desirable, but not necessary, that the light pipe material have sufficient hardness or abrasion resistance to withstand the rigors of the polishing process, at is least to the same extent as the polishing pad, to minimize the frequency of light pipe replacement.

In a further alternative embodiment, the light pipe may be formed in situ. Thus, once a suitably sized throughbore has been formed in the pad, the bore may be filled with an optically transparent material that will cure and harden to form a light pipe. This method offers certain advantages, in that the light pipe so formed adheres to the pad material, as well as the distal tip of the optical fiber 20, if the optical fiber is placed in position before the composition hardens to form the light pipe.

Figure 5:
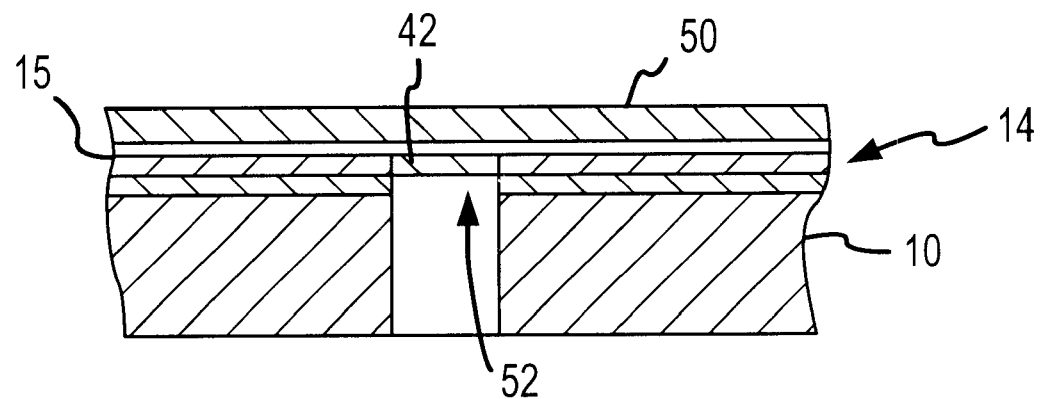
FIG. 5 is an embodiment of the invention including a hydrophobic window in a polishing pad.

In accordance with another embodiment of the invention, a window 42 that is transmissive of light for optical endpoint detection, is formed or inserted into a polishing pad 14. The window 42 is of a hydrophobic material (such as silicone), and thereby repels (aqueous) chemical slurry from its surface. Further, the window preferably has a polishing surface that is co-extensive or flush with the polishing surface of the polishing pad so that it does not cause a surface irregularity in the pad that may interfere with uniform polishing of the workpiece 50. Preferably, the window 42 is of a material that has a similar wear pattern to the material of the polishing pad surface layer 15. Alternatively, the window 42 may be located as shown in FIG. 5 with a back to an open space 52, so that if the window 42 were to wear less than the pad surface layer 15, and over time begin to protrude slightly beyond the surrounding pad surface, then pressing the pad against the workpiece will result in the window yielding and moving away from the workpiece (into space 52) until the polishing surface of the window is flush with surrounding surface of the polishing pad.

Figure 6:
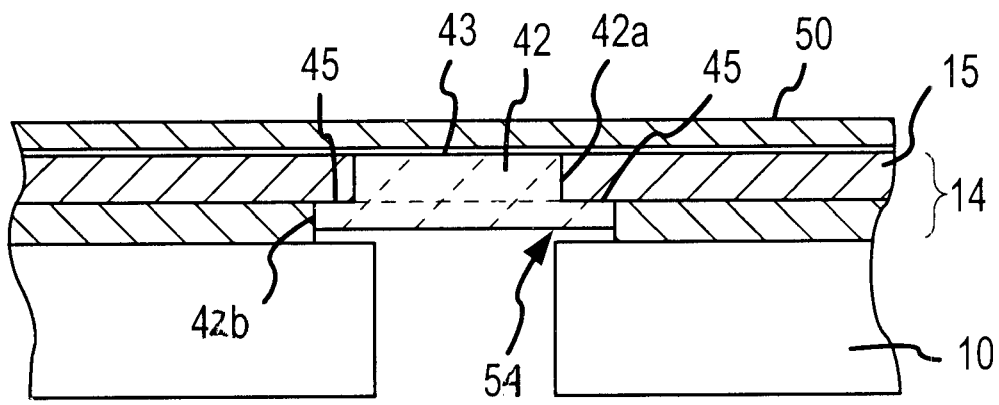
FIG. 6 is another embodiment of the invention showing a different version of a hydrophobic window in a polishing pad.

Similarly, FIG. 6 is a schematic illustration of a cross-section through a polishing pad 14 mounted to a platen 10 with a window 42 having, in cross-section, a stepped configuration. Thus, the smaller portion 42a of the step configuration preferably has a surface 43 co-extensive or flush with the polishing surface of the polishing pad. A wall 45 of the step section abuts against a rear surface of the polishing pad, and the larger cross-sectional portion 42b of the window overlaps and abuts against a back surface of the pad to hold the window 42 in place in the pad. The larger portion of the window 42b is preferably spaced from the platen 16 by a small tolerance gap or space 54. Thus, when the pad is subject to wear, and wears more readily or more quickly than the window material, the resultant protruding window 42 will be pushed through gap 54 until the window's rear surface contacts the platen, thereby permitting the polishing surface 43 of the window to become co-planar with the polishing surface of the polishing pad 14. Clearly, when the pad wear relative to the window exceeds the amount of tolerance allowed, the window will no longer be able to align with its polishing surface flush with the polishing pad's surface. At this point, consideration should be given to pad replacement.

The following example illustrates the usefulness of aspects of the invention and does not limit the scope of the invention as set forth and claimed herein.

EXAMPLE

A workpiece (semiconductor wafer) with a copper plating on its surface was subjected to chemical mechanical polishing, and reflectance from its surface was measured to compare performance of an embodiment of the invention with the prior art. As a preliminary matter, as polishing proceeds on a copper surface, and as the copper layer is polished through, there is an expectation that the reflectance value will decrease to approximately one half of pure copper reflectance, with variations depending upon the amount of remaining metallization in wafer trenches and in lower layers of the workpiece. In the following example, the copper was intentionally not "cleared", to show system stability while polishing only copper.

Figure 7:
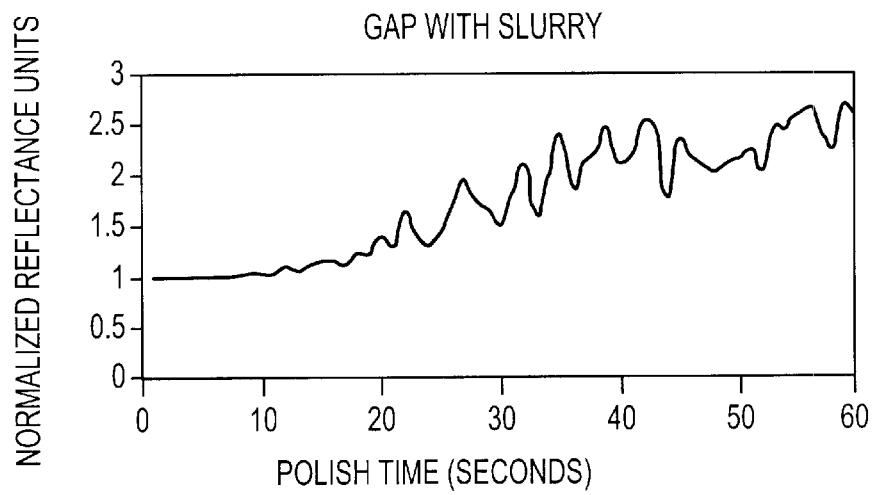
FIG. 7 is a graph of normalized light reflectance vs. time.

A prior art system, such as that illustrated in FIG. 1, with a recessed optical fiber connecting through a platen to view a workpiece, was used as a prior art control. During the polishing of the workpiece, the gap between the tip of the optical fiber and the polishing surface of the pad filled with chemical slurry. The slurry foamed or bubbled, causing a dramatic increase in the amount of light reaching the optical detector, causing normalized reflectance signals to increase from 1.0 to over 2.5, as shown in FIG. 7.

Figure 8:
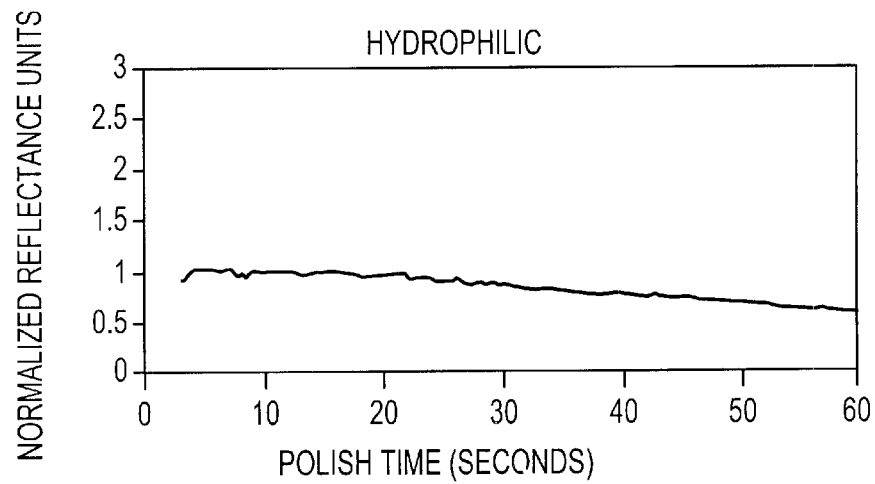
FIG. 8 is a graph of normalized light reflectance vs. time.

Recognizing the effect of the gap in retaining slurry, the pad was cleaned and a light type of polyurethane was installed in the gap, with a polish surface surface flush with the surface of the polishing pad. Urethane and polyurethane light pipes are generally hydrophilic, especially when the surfaces have been conditioned with an abrasive, as is the usual practice in the chemical mechanical polishing industry. The inserted polyurethane light pipe eliminated the problems associated with bubbling or foaming of the slurry, but tended to pick up polish debris. As shown in FIG. 8, the reflectance signal tended to decrease with time, indicating the progressive fouling of the polyurethane material that tended to reduce light transmission. During a 60 second period, the signal strength decreased by about 40% of initial signal strength.

Figure 9:
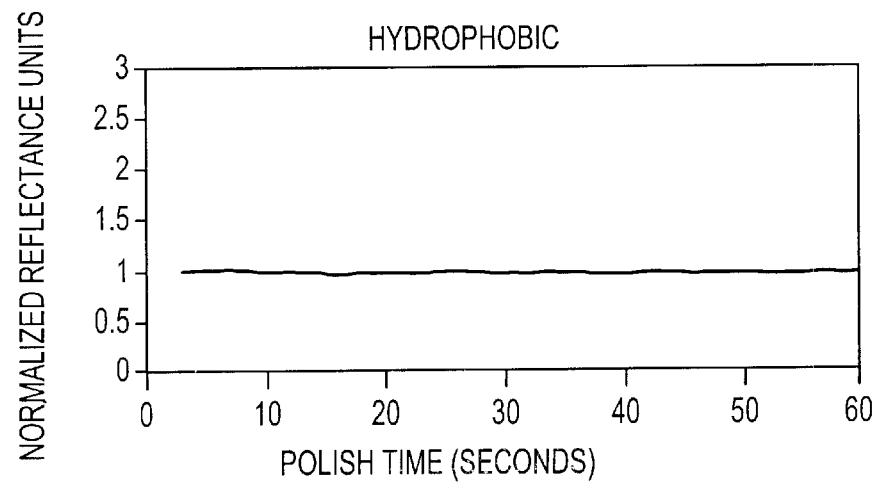
FIG. 9 is a graph of normalized light reflectance vs. time.

In accordance with the invention, a hydrophobic light pipe was substituted for the hydrophilic polyurethane light pipe. As shown in FIG. 9, the reflectance over the same period of 60 seconds remained substantially constant, decreasing by an estimated 5% only. This reduction is relatively insignificant and points out an advantage of the invention. The following table shows the change in reflectance signal amplitude for the prior art (no light pipe with gap between fiber optic and polish pad surface); hydrophilic light pipe and the preferred hydrophobic light pipes of the invention:

TABLE I

| Seconds | No pipe | Hydrophilic Pipe | Hydrophobic Pipe |
| --- | --- | --- | --- |
| 10 | 0.98 | 1.00 | 1.00 |
| 20 | 1.07 | 0.98 | 0.98 |
| 30 | 1.54 | 0.92 | 0.98 |
| 40 | 2.15 | 0.81 | 0.97 |
| 50 | 2.30 | 0.73 | 0.96 |
| 60 | 2.55 | 0.62 | 0.95 |

From the foregoing FIGURES and Table, it is apparent that the invention provides significant advantages over the prior art. The invention substantially eliminates any interference effects caused by air bubbles in chemical slurry, and reduction in normalized reflectance due to accumulation of polished debris on the sensing end of the light pipe or window.

The foregoing description provides an enabling disclosure of the invention, which is not limited by the description, but only by the scope of the appended claims. All those other aspects of the invention, and their equivalents, that will become apparent when a person of skill in the art has read the foregoing, are within the scope of the invention and of the claims hereinbelow.

What is claimed is:

1. An apparatus for optical detection of endpoint in a chemical mechanical process, the apparatus comprising:
   (a) a platen;
   (b) a polishing pad mounted to a surface of the platen;
   (c) a hydrophobic light pipe extending through a canal which may be used for the delivery of slurry wherein one end of the pipe is located substantially co-planar with a polishing surface of the polishing pad such that the end of the pipe is exposed for optical communication with a workpiece during polishing; and
   (d) a light detector in optical communication with the light pipe.

2. The apparatus of claim 1, wherein the end of the light pipe is a plug of hydrophobic optically transparent polymer.

3. The apparatus of claim 1, wherein the light pipe has a substantially transparent body coated with a hydrophobic composition.

4. The apparatus of 1, wherein the end of the light pipe is formed in-situ by curing of a substantially optically transparent liquid comprising a hydrophobic polymer.

5. The apparatus of claim 1, wherein the end of the light pipe is a substantially cylindrical plug of hydrophobic polymer adhered to a bore in the polishing pad.

6. The apparatus of claim 1, wherein the end of the light pipe is in contact with a workpiece during polishing of the workpiece.

* * * * *